United States Patent
Chang et al.

(10) Patent No.: US 6,486,496 B2
(45) Date of Patent: Nov. 26, 2002

(54) POLYSILICON THIN FILM TRANSISTOR STRUCTURE

(75) Inventors: Ting-Chang Chang, Hsinchu (TW); Hsiao-Wen Zan, Hsinchu (TW); Po-Sheng Shih, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/994,322

(22) Filed: Nov. 26, 2001

(65) Prior Publication Data

US 2002/0153527 A1 Oct. 24, 2002

Related U.S. Application Data

(62) Division of application No. 09/845,438, filed on Apr. 30, 2001, now Pat. No. 6,410,373.

(30) Foreign Application Priority Data

Apr. 24, 2001 (TW) .......................................... 90109736 A

(51) Int. Cl.[7] .............................................. H01L 21/108
(52) U.S. Cl. ........................................ 257/70; 257/352
(58) Field of Search ............................ 257/66, 70, 352, 257/350

(56) References Cited

U.S. PATENT DOCUMENTS

| | | | | |
|---|---|---|---|---|
| 5,600,169 A | * | 2/1997 | Burgener et al. | ............ 257/352 |
| 6,140,684 A | * | 10/2000 | Chan et al. | ................. 257/368 |
| 6,306,721 B1 | * | 10/2001 | Teo et al. | .................... 438/396 |
| 6,316,789 B1 | * | 11/2001 | Yamazaki et al. | ............. 257/66 |

* cited by examiner

*Primary Examiner*—Richard Elms
*Assistant Examiner*—Brad Smith

(57) ABSTRACT

A method of forming a polysilicon thin film transistor. An amorphous silicon channel layer is formed over an insulating substrate. An active region is patterned out in the amorphous silicon channel layer. An oxide layer and a gate electrode are sequentially formed over the amorphous silicon channel layer. A lightly doped source/drain region is formed in the amorphous silicon channel layer and then a spacer is formed over the gate electrode. A source/drain region is formed in the amorphous silicon channel layer. A portion of the oxide layer above the source/drain region is removed. An isolation spacer is formed on the sidewalls of the spacer. A self-aligned silicide layer is formed at the top section of the spacer and the source/drain region. Finally, a metal-induced lateral crystallization process is conducted to transform the amorphous silicon channel layer into a lateral-crystallization-polysilicon channel layer.

12 Claims, 2 Drawing Sheets

POLYSILICON THIN FILM TRANSISTOR STRUCTURE

CROSS-REFERENCE TO RELATED APPLICATION

This application is a divisional of U.S. application Ser. No. 09/845,438, filed on Apr. 30, 2001 now U.S. Pat. No. 6,410,373.

This application claims the priority benefit of Taiwan application serial no. 90109736, filed on Apr. 24, 2001.

BACKGROUND OF THE INVENTION

1. Field of Invention

The present invention relates to a method of manufacturing an integrated circuit device. More particularly, the present invention relates to a method of forming a polysilicon thin film transistor (poly-Si TFT) structure.

2. Description of Related Art

Thin film transistors are often used in active matrix liquid-crystalline devices (AMLCD) and static random access memory (SRAM). A thin film transistor can be classified as belonging to an amorphous silicon thin film type or a polysilicon thin film type. A polysilicon thin film transistor is able to provide higher carrier mobility and higher conductive current than an amorphous silicon thin film transistor. Furthermore, a polysilicon thin film transistor can be directly used in a peripheral circuit for forming the logic drivers of a display device. Since the driver circuit and the thin film transistor array can be fabricated on the same glass panel with a reduction of production cost, polysilicon thin film transistors are frequently used in liquid crystal display (LCD) panels. However, polysilicon thin film transistors generally produce a relatively large leakage current. In addition, the polysilicon thin film transistors must be able to attain a certain speed before they can be considered suitable for applications in logic circuit. Therefore, polysilicon thin film transistors are rarely used in large area liquid crystal display. To be incorporated inside a large area liquid crystal display, leakage current from the polysilicon thin film transistor must be reduced and operating speed of the transistor must be increased.

A major factor that may affect the amount of leakage current from a polysilicon thin film transistor includes the size of the electric field in the neighborhood of its drain terminal. To reduce leakage current, the electric field in the depletion region of a drain terminal must be reduced. The conventional method of reducing the electric field in the depletion region of a drain terminal is to produce a polysilicon thin film transistor with a lightly doped drain terminal or a gate-overlapped lightly doped drain.

Although the production of a lightly doped region between the drain terminal and the gate terminal of a polysilicon thin film transistor is able to reduce electric field in the depletion region and hence leakage current, electrical resistance is increased considerably in the lightly doped region. Hence, the amount of conductive current permitted to pass through the device is reduced and the response speed of the device is greatly lowered when the device is conductive.

In a polysilicon thin film transistor with a gate-overlapped lightly doped drain terminal, the lightly doped drain terminal is under the gate electrode so that the gate electrode and the lightly doped region overlap. In the conductive state, the gate electrode is able to sense the carriers in the lightly doped region, thereby lowering the resistance and maintaining a normal conductive current. In the non-conductive state, resistance is increased due to the expulsion of carriers from the lightly doped region by a gate voltage. Similarly, the electric field in the depletion region is lowered and leakage current is suppressed. However, in this type of structure, a highly conductive material such as polysilicon must be used to form the spacers. If, furthermore, metal silicide material is used to lower the resistance at a source/drain terminal, a conductive path is created between the gate electrode and the source/drain terminal. Hence, intrinsic properties of the device may be further damaged.

On the other hand, a principle factor that affects the operating speed of a polysilicon thin film transistor includes defects at polysilicon grain boundaries. Defects in these grain boundaries tend to trap carriers and set up regional potential barriers. By increasing the size of grains so that the number of crystal boundaries crossed per unit length is decreased, response speed of the polysilicon thin film transistor will increase considerably. The conventional method of increasing the size of polysilicon crystals includes solid phase crystallization (SPC), laser re-crystallization and metal-induced lateral crystallization (MILC).

To perform solid phase crystallization, a substrate with an amorphous silicon layer is placed inside a furnace. The furnace is heated to 600° C. and the amorphous silicon layer is treated for a period of 24 hours so that the amorphous silicon is transformed into polysilicon. However, the high temperature treatment limits the type of material that can be used to form the bottom glass panel of a liquid crystal display. Hence, the production cost of the liquid crystal display panel is increased.

To perform a laser re-crystallization, a the amorphous silicon layer is scanned with a laser beam. Thermal energy produced by the laser beam re-crystallizes the amorphous silicon into polysilicon. Although re-crystallization temperature and defect density along the crystal boundaries are lowered, the polysilicon layer thus formed has a very rough surface which leads to intense dispersion at the interface between a polysilicon channel and a gate oxide layer. Ultimately, carrier mobility is greatly lowered. In addition, the polysilicon crystals resulting from laser re-crystallization are perpendicular to the channel and have a columnar form. Hence, size increase of crystals in a direction parallel to the channel is limited.

Metal-induced lateral crystallization (MILC) is a method capable of producing crystal growth in a direction parallel to the channel. After the completion of a conventional cap gate and gate production process, a metallic layer (for example, a nickel layer) is formed over the source/drain terminal. The wafer is heated to a temperature of about 500° C. Utilizing the metal silicide above the source/drain terminal as a seed nucleus, crystals grow laterally from a source/drain region and extend into the channel region underneath the gate electrode. Under suitable growing conditions, lateral width of a crystal may be as long as 10μm and carriers rarely encounter a crystal boundary when traversing the channel. However, in the process of forming the lateral crystals, a large number of defects are also created at the interface between the metal-induced crystals and the metal-induced lateral crystal so that operating speed of the device is lowered. To remove the interface between the metal-induced crystals and the metal-induced lateral crystal from the channel region, a masking procedure can be carried out. However, this extra step will increase production cost.

SUMMARY OF THE INVENTION

Accordingly, one object of the present invention is to provide a method of forming a polysilicon thin film transistor capable of reducing leakage current from the transistor and resistance at its source terminal, drain terminal and gate terminal. The method is further capable of improving the electrical properties of the transistor.

A second object of the invention is to provide a method of forming a polysilicon thin film transistor capable of reducing carrier mobility drop and hence current drop due to the crystal boundary crossing of carriers. Hence, operating speed of the transistor is increased and electrical properties of the transistor are improved.

A third object of the invention is to provide a method of forming a polysilicon thin film transistor having a double-layered spacer structure capable of suppressing leakage current and excluding its metal-induced crystal/metal-induced lateral crystal interface from its channel region at the same time. Although the interface contains more defects, the defect-ridden interface lies in the source/drain region without affecting any properties of the transistor.

To achieve these and other advantages and in accordance with the purpose of the invention, as embodied and broadly described herein, the invention provides a method of forming a polysilicon thin film transistor. First, an insulating substrate is provided. An amorphous channel layer is formed over the substrate. Photolithographic and etching techniques are used to pattern out an active region in the amorphous silicon channel layer. An oxide layer and a conductive layer are sequentially formed over the amorphous silicon channel layer. The conductive layer is patterned to form a gate electrode. Thereafter, using the gate electrode as a mask, a lightly doped source/drain region is formed in the amorphous silicon channel layer. A spacer that encloses the gate electrode is formed. A source/drain region is formed in the amorphous silicon channel layer. Using the spacer and the gate electrode as a mask, a portion of the oxide layer above the source/drain terminal is removed. Hence, an isolation spacer is formed on the sidewalls of the original spacer while the top section of the original spacer is exposed. A self-aligned silicide layer is formed over the top section of the original spacer and the source/drain region. Finally, a metal-induced lateral crystallization process is conducted to transform the amorphous silicon channel layer into a lateral-crystallization-polysilicon channel layer.

The spacer may be formed only on sidewalls of the gate electrode while exposing a top of the gate electrode, so that a self-aligned silicide is formed on the top of the gate electrode.

This invention also provides a polysilicon thin film transistor structure. The structure includes an insulating substrate and a metal-induced lateral crystallization polysilicon channel layer above the substrate. The metal-induced lateral crystallization polysilicon channel layer further includes a channel region, a lightly doped source/drain region and a source/drain region. The lightly doped source/drain region is adjacent to the channel region and the source/drain region is adjacent to the lightly doped source/drain region. An oxide layer lies above the metal-induced lateral crystallization polysilicon channel layer and covers both the channel region and the lightly doped source/drain region. A gate electrode is on the oxide layer inside the channel region. A first spacer covers the gate electrode entirely. A second spacer attaches to the sidewall of the first spacer. A self-aligned metal silicide layer lies on the top section of the first spacer and a portion of the exposed source/drain region.

The spacer may be formed only on sidewalls of the gate electrode while exposing a top of the gate electrode, so that a self-aligned silicide is formed on the top of the gate electrode.

One major aspect of this invention is the utilization of double-layered spacer technique and metal-induced lateral crystallization technique to fabricate a polysilicon thin film transistor. The transistor so formed has a smaller leakage current and a faster operating speed. Further, the interface between metal-induced crystallization region and metal-induced lateral crystallization region is excluded from the channel area so that any defects in the interface will not affect any operating properties of the transistor.

Leakage current from the transistor is greatly reduced by selectively depositing polysilicon or polysilicon-germanium material over the gate electrode to form a spacer that serves as a lightly doped drain structure over the gate electrode.

In addition, the application of a self-aligned technique to form a metal silicide layer over the gate electrode and the source/drain region reduces overall resistance at the gate and the source/drain terminal.

Furthermore, the metal silicide layer above the source/drain region is utilized to initiate a metal-induced lateral crystallization so that amorphous silicon within the channel layer is transformed into a lateral-crystallization-polysilicon channel layer. Ultimately, a channel with large crystals is produced and carrier mobility and hence operating speed is greatly increased. Moreover, the double-layered spacer structure permits the exclusion of the metal-induced crystallization/metal-induced lateral crystallization interface from the channel region. Although the interface may contain a great number of defects, the interface is located within the source/drain region. Hence, the transistor device is unaffected by such interface defects.

It is to be understood that both the foregoing general description and the following detailed description are exemplary, and are intended to provide further explanation of the invention as claimed.

DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
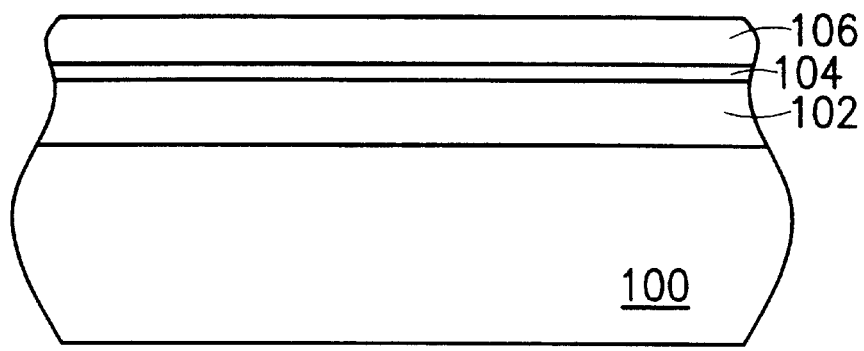
FIGS. 1A through 1F are schematic cross-sectional views showing the progression of steps for forming a polysilicon thin film transistor according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1F are schematic cross-sectional views showing the progression of steps for forming a polysilicon thin film transistor according to one preferred embodiment of this invention.

As shown in FIG. 1A, an insulating substrate 100 is provided. An amorphous silicon channel layer 102 is formed over the insulating substrate 100 by, for example, chemical vapor deposition. Conventional photolithographic and etching processes are used to pattern out an active area in the amorphous silicon channel layer 102. An oxide layer 104 is formed over the amorphous silicon channel layer 102. The oxide layer 104 can be a silicon oxide layer formed, for example, by thermal oxidation. A conductive layer 106 is formed over the oxide layer 104. The conductive layer 106 can be a polysilicon layer or a polysilicon-germanium layer formed, for example, by chemical vapor deposition.

Figure 1B:
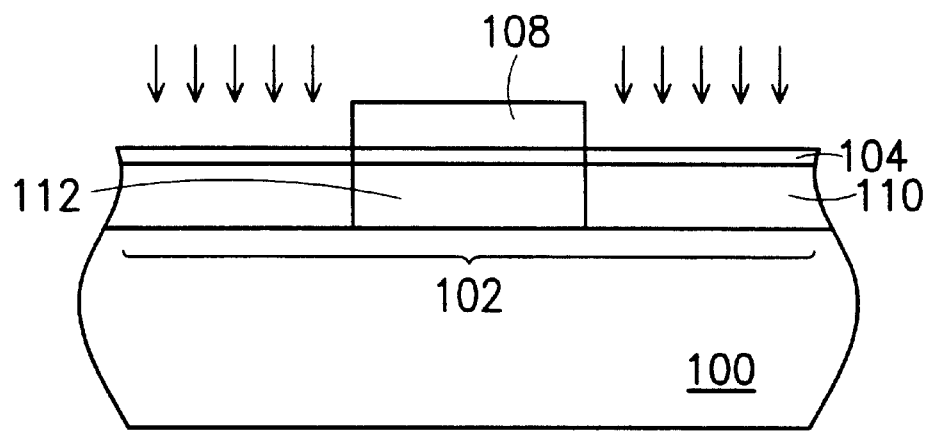

As shown in FIG. 1B, the conductive layer 106 is patterned to form a gate electrode 108. The gate electrode 108 is formed, for example, by photolithographic and etching processes. Using the gate electrode 108 as a mask, a low-dopant-concentration implantation is carried out to form a lightly doped region in the amorphous silicon channel layer 102. The lightly doped region is a lightly doped source/drain region 110 formed, for example, by selectively implanting $N^-$ions into the amorphous silicon channel layer 102 (indicated by arrows). A channel region 112 is formed underneath the gate electrode 108.

Figure 1C:
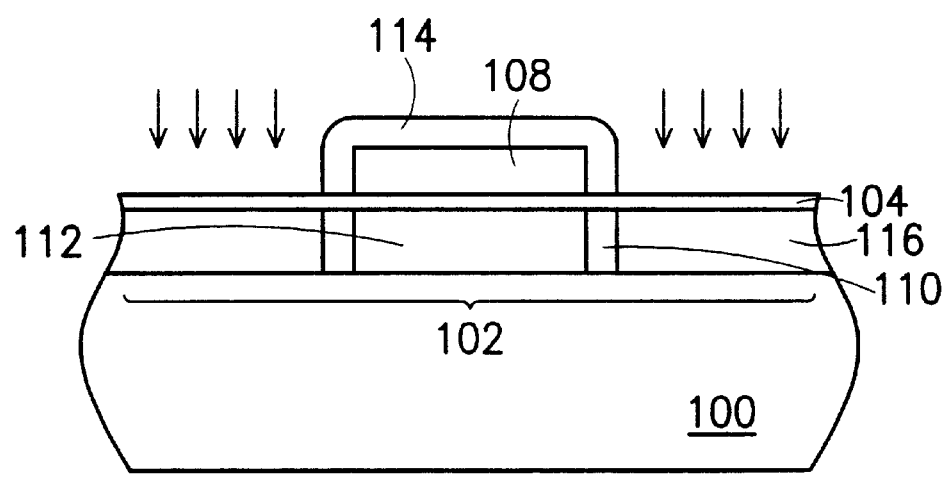

As shown in FIG. 1C, conductive material is selectively deposited over the gate electrode 108 to form a spacer 114 that completely encloses the gate electrode 108. The spacer 114 can be a polysilicon or a polysilicon-germanium layer formed, for example, by ultra-high-vacuum chemical vapor deposition (UHVCVD). Because polysilicon or polysilicon-germanium has a long incubation period over a silicon oxide layer but rapid deposition over a polysilicon layer, polysilicon or polysilicon germanium is selectively deposited over the gate electrode 108. Alternatively, a chemical vapor deposition may be carried out to form a conductive material layer over the gate electrode and the oxide layer 104. This is followed by performing an anisotropic etching to remove a portion of the conductive material. A high-dopant-concentration implantation of the amorphous silicon channel layer 102 is conducted (indicated by arrows) while using the spacer-covered gate electrode 108 as a mask to form a heavily doped region on each side of the amorphous silicon channel layer 102. The heavily doped region is a source/drain region 116 formed, for example, by implanting $N^+$ions selectively into the amorphous silicon channel layer 102.

Figure 1D:
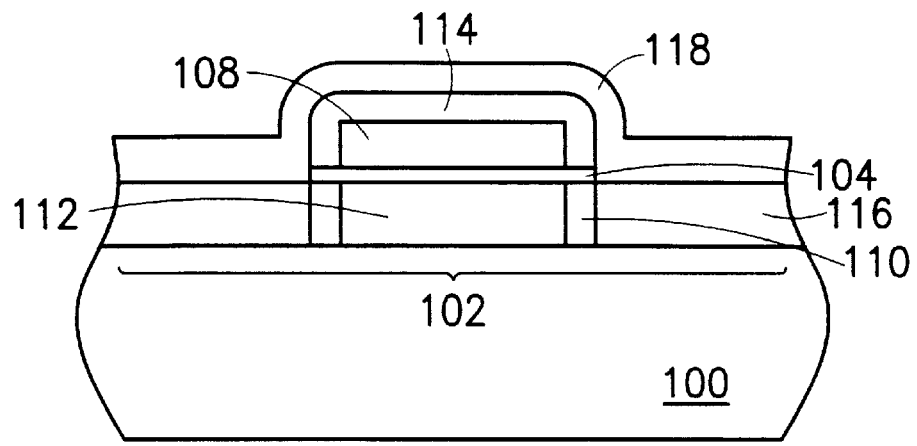

As shown in FIG. 1D, the oxide layer 104 above the source/drain region 116 is removed. The oxide layer 104 is removed, for example, by wet etching using hydrofluoric acid as an etchant. An insulating layer 118 is formed over the entire insulating substrate 100. The insulation layer 118 is a material layer that has a vastly different etching rate from the spacer 110 such as a silicon oxide layer or a silicon nitride layer. The insulation layer 118 is formed, for example, by plasma-enhanced chemical vapor deposition (PECVD).

Figure 1E:
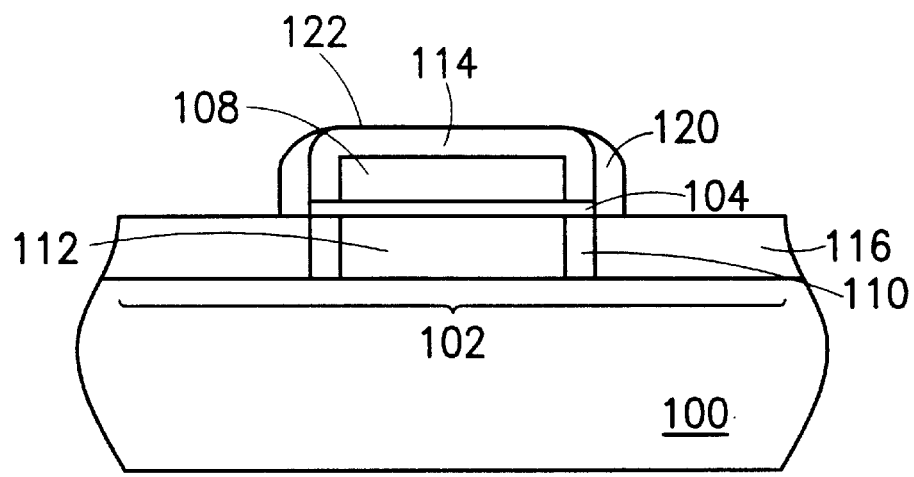
Figure 1F:
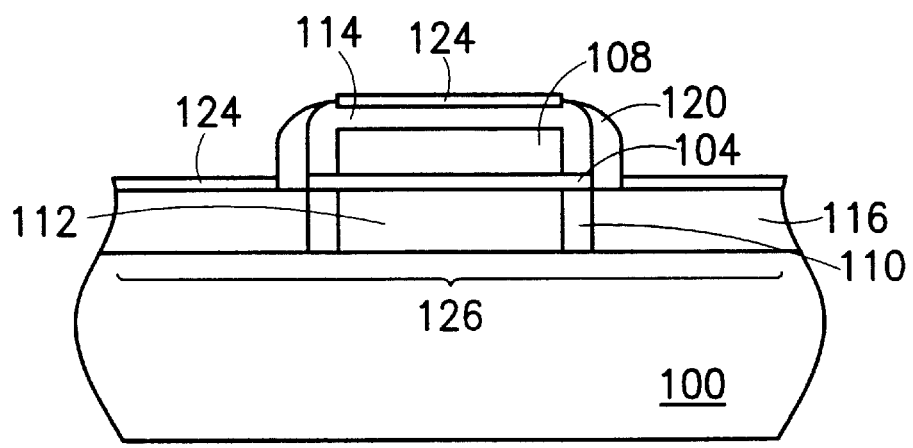

As shown in FIG. 1E, a portion of the insulation layer 118 is removed to form an isolation spacer 120 on the sidewall of the spacer 114 so that a top section 122 of the spacer 114 is exposed. The isolation spacer 120 is formed, for example, by anisotropic etching.

As shown in FIG. IF, a self-aligned silicide layer 124 is formed over the substrate 100. The self-aligned silicide layer 124 can be a nickel silicide layer, a tungsten silicide layer, a cobalt silicide layer, a titanium silicide layer, a platinum silicide layer or a palladium silicide layer, for example. The self-aligned silicide layer 124 is formed, for example, by performing molecular beam evaporation or DC magnetron sputtering to form a refractory metal layer (not shown) having a thickness between about 200Å and 1000Å over the entire wafer. The refractory metal layer is formed using material such as nickel, tungsten, cobalt, titanium, platinum or palladium. A rapid thermal process is conducted so that a portion of the refractory metal reacts with the silicon at the top section 122 of the spacer 114 and the source/drain region 116 to form the self-aligned silicide layer 124. Thereafter, the unreacted refractory metal is removed, for example, by wet etching using hydrochloric acid as an etchant.

A metal-induced lateral crystallization process is conducted at a suitable temperature (for example, below 500° C. and preferably between about 300° C. and 500° C.) for a preset period. Using the self-aligned silicide layer 124 above the source/drain region 116 as a seed nucleus, lateral crystallization of the amorphous silicon channel layer 102 is induced. Ultimately, a polysilicon channel layer 126 (a metal-induced lateral crystallization polysilicon channel layer) and hence a complete polysilicon thin film transistor is formed.

This invention also provides a polysilicon thin film transistor having a structure shown in FIG. IF. The polysilicon thin film transistor structure includes an insulating substrate 100 and a metal-induced lateral crystallization channel layer 126 above the insulating substrate 100. The metal-induced lateral crystallization polysilicon channel layer 126 further includes a channel region 112, a lightly doped source/drain region 110 and a source/drain region 116. The lightly doped source/drain region 110 is adjacent to the channel region 112 and the source/drain region 116 is adjacent to the lightly doped source/drain region 110. An oxide layer 104 lies above the metal-induced lateral crystallization polysilicon channel layer 126 and covers both the channel region 112 and the lightly doped source/drain region 110. A gate electrode 108 is on oxide layer 104 inside the channel region 112. A first spacer 114 encloses the gate electrode 108. A second spacer 120 attaches to the sidewall of the first spacer 114 but exposes the top section of the first spacer 114. A self-aligned metal silicide layer 124 lies on the top section of the first spacer 114 and a portion of the exposed source/drain region 116.

In brief, this invention provides a polysilicon thin film transistor structure and corresponding method of manufacture. The structure reduces overall leakage current from various terminals of the transistor and lowers resistance of its source/drain terminals and gate electrode. Therefore, operating speed of the transistor is increased and production yield of the semiconductor devices is improved.

In conclusion, major advantages of this invention include:

1. Utilizing the long incubation period of polysilicon or polysilicon-germanium material on a silicon oxide layer, polysilicon or polysilicon-germanium can be selectively deposited over a polysilicon layer so that a gate-covered lightly doped drain structure is directly formed. Alternatively, a chemical vapor deposition is conducted to deposit a layer of polysilicon or polysilicon-germanium followed by an anisotropic etching operation to remove a portion of the polysilicon or polysilicon-germanium layer. Hence, thickness of the spacer can be accurately controlled and a gate-covered lightly doped source/drain polysilicon thin film transistor can be easily fabricated. Ultimately, leakage current from the transistor is effectively lowered.

2. Self-aligned technique is used to form a metal silicide layer over the gate electrode and the source/drain terminals. Since metal silicide material has a resistance far lower than polysilicon, resistance at the gate electrode and the source/drain region is greatly lowered.

3. Using the metal silicide material above the source/drain region to induce lateral crystallization, the amorphous silicon channel layer is crystallized into a polysilicon channel having larger crystal grains. Thus, carrier mobility in the channel is increased and response speed of the transistor is improved.

4. Using a double-spacer structure, leakage current from the transistor is suppressed. Moreover, the metal-induced crystallization/metal-induced lateral crystallization interface is excluded from the effective channel region. Although the interface may contain many defects, these defects will not affect the electrical properties of the transistor because the interface lies in the source/drain region.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A polysilicon thin film transistor structure, comprising:
   an insulating substrate;
   a metal-induced lateral crystallization polysilicon channel layer above the insulating substrate, wherein the metal-induced lateral crystallization polysilicon channel layer includes a channel region, a lightly doped source/drain region and a source/drain region, the lightly doped source/drain region is adjacent to the channel region and the source/drain region is adjacent to the lightly doped source/drain region;
   an oxide layer above the metal-induced lateral crystallization polysilicon channel layer and covering the channel region and the lightly doped source/drain region;
   a gate electrode above the oxide layer within the channel region;
   a spacer over the gate electrode and sidewalls of the gate electrode;
   an isolation spacer on sidewalls of the spacer; and
   a self-aligned silicide layer over the top of the gate electrode and an exposed portion of the source/drain region.

2. The structure of claim 1, wherein the gate electrode comprises polysilicon-germanium or polysilicon.

3. The structure of claim 1, wherein the spacer comprises polysilicon-germanium or polysilicon.

4. The structure of claim 1, wherein the oxide layer includes a silicon oxide layer.

5. The structure of claim 1, wherein the isolation spacer comprises silicon oxide or silicon nitride.

6. The structure of claim 1, wherein the self-aligned silicide layer is made of a material selected from a group consisting of nickel silicide, tungsten silicide, cobalt silicide, titanium silicide, platinum silicide and palladium silicide.

7. A polysilicon thin film transistor structure, comprising:
   an insulating substrate;
   a lateral-crystallization-polysilicon channel layer above the insulating substrate, wherein the lateral-crystallization-polysilicon channel layer includes a channel region, a lightly doped source/drain region and a source/drain region, the lightly doped source/drain region is adjacent to the channel region and the source/drain region is adjacent to the lightly doped source/drain region;
   an oxide layer above the lateral-crystallization-polysilicon channel layer and covering the channel region and the lightly doped source/drain region;
   a gate electrode above the oxide layer within the channel region;
   a conductive-material-based spacer over the gate electrode and sidewalls of the gate electrode;
   an isolation spacer on sidewalls of the conductive-material-based spacer; and
   a self-aligned silicide layer over the top of the gate electrode and an exposed portion of the source/drain region.

8. The structure of claim 7, wherein the gate electrode comprises polysilicon-germanium or polysilicon.

9. The structure of claim 7, wherein the conductive-material-based spacer comprises polysilicon-germanium or polysilicon.

10. The structure of claim 7, wherein the oxide layer includes a silicon oxide layer.

11. The structure of claim 7, wherein the isolation spacer comprises silicon oxide or silicon nitride.

12. The structure of claim 7, wherein the self-aligned silicide layer is made of a material selected from a group consisting of nickel silicide, tungsten silicide, cobalt silicide, titanium silicide, platinum silicide and palladium silicide.

* * * * *